United States Patent [19]
Osburn et al.

[11] Patent Number: 5,430,456
[45] Date of Patent: Jul. 4, 1995

[54] ELECTROMAGNETIC INTERFERENCE TESTING APPARATUS

[75] Inventors: John D. M. Osburn; Patrick A. Tobola, both of Austin, Tex.

[73] Assignee: The Electro-Mechanics Company, Austin, Tex.

[21] Appl. No.: 851,078

[22] Filed: Mar. 13, 1992

[51] Int. Cl.6 ...................... H01Q 17/00; G01R 31/00
[52] U.S. Cl. .................................................... 343/703
[58] Field of Search ............... 343/703, 763, 765, 766, 343/878, 882; 342/360; 174/35 MS; G01R 31/00; H01Q 17/00

[56] References Cited

U.S. PATENT DOCUMENTS

| | | | |
|---|---|---|---|
| 4,754,496 | 6/1988 | Fishkin et al. | 343/703 |
| 4,837,581 | 6/1989 | Hansen et al. | 343/703 |
| 4,968,983 | 11/1990 | Maeda | 343/703 |
| 5,001,494 | 3/1991 | Dorman et al. | 343/703 |

OTHER PUBLICATIONS

"Simplifying EMI Immunity (susceptibility) Tests in TEM Cells" by Edwin L. Bronaugh, Principal EMC Scientist, The Electro Mechanics Company, published in Proceedings of IEE, 1990 (month unknown) pp. 488–491.

Primary Examiner—Donald Hajec
Assistant Examiner—Hoanganh Le
Attorney, Agent, or Firm—Gambrell, Wilson & Hamilton

[57] ABSTRACT

A transverse electromagnetic (TEM) cell for measuring EM emissions. The TEM cell longitudinal axis is positioned at a fixed angle relative to the horizontal. This fixed angle results in the alignment of the orthoaxis of the TEM cell with the gravity vector. A rotatable platform for supporting an electronic device is positioned inside the TEM cell. The platform is mounted horizontally, and its axis of rotation is vertical (i.e. parallel to the gravity vector). Further, the rotation axis of the rotatable platform intersects the test volume of the TEM cell. Three mutually orthogonal components of EM emissions are measured successively by placing a device on the platform and rotating the device through two 120 degree rotations, thereby measuring three positions. Thus, it is not necessary to tilt the device from a normal, horizontal operating position in order to fully test its EM emissions.

7 Claims, 5 Drawing Sheets

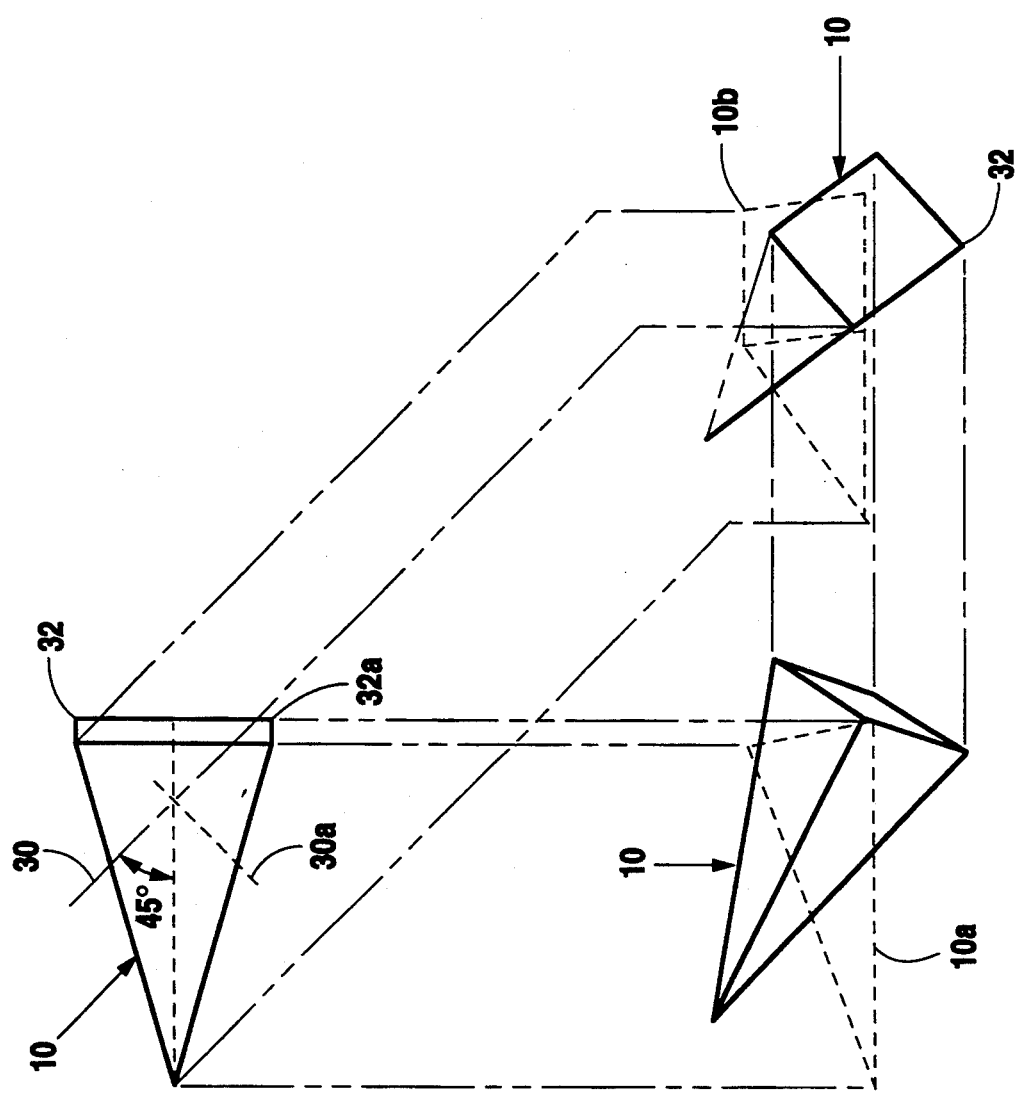

ELECTROMAGNETIC INTERFERENCE TESTING APPARATUS

FIELD OF INVENTION

The present invention relates generally to an apparatus for measuring electromagnetic (EM) emissions from, or electromagnetic immunity of, an electronic device. More specifically, the present invention provides an improved gigahertz transverse electromagnetic cell (TEM) for measuring EM emissions from a device under test (DUT) without the need to tilt the device under test from its normal horizontal position.

BACKGROUND

Transverse Electromagnetic cells are often used to measure radiated EM emissions from electronics devices. Certain agencies, such as the Federal Communications Commission (FCC), require the measurement of EM emissions in order to guarantee that the electronic devices are not radiating EM emissions above limits specified by the agencies. These limits are based upon open area test site (OATS) measurement standards. Because a TEM cell can only measure EM emissions in a direction perpendicular to its longitudinal axis, a device under test must be repositioned during testing in such a way as to measure three mutually orthogonal vector components of these emissions. This repositioning involves rotating and tilting the device to change its orientation relative to the cell's longitudinal axis. Once the three sets of measurements are complete, they may be mathematically correlated for comparison to the OATS standard.

Because the longitudinal axis of most TEM cells is horizontal, or parallel to the ground, one of the three orthogonal components can be simply measured. Measurement of the two additional orthogonal components, however, requires rotating a device under test 90 degrees in two planes, which includes reorientation of the device from a horizontal to a vertical position wherein the device's orientation changes in relationship to the gravity vector. Some devices cannot be titled for measurement in a TEM cell without damaging the device or significantly modifying its operating characteristics.

There is a need, therefore, for a TEM cell that can measure three orthogonal components of EM emissions without requiring tilting of an electronic device from a normal, horizontal position. The testing apparatus of the present invention, described in greater detail below, provides a means for measuring three orthogonal components of EM emissions from an electronic device without requiring such realignment.

SUMMARY OF THE INVENTION

The present invention provides a TEM cell for measuring EM emissions having its longitudinal axis positioned at a fixed angle relative to the horizontal. This fixed angle results in the alignment of the orthoaxis of the TEM cell (defined as an axis parallel to a diagonal of a three dimensional cube having sides of unit length) with the gravity vector.

A rotatable platform for Supporting an electronic device is positioned inside the TEM Cell. The platform is mounted horizontally, and its axis of rotation is vertical (i.e. parallel to the gravity vector). Further, the rotation axis of the rotatable platform intersects the test volume of the TEM cell.

According to the present invention, three mutually orthogonal components of EM emissions are measured successively by placing a device on the platform and rotating the device through two 120 degree rotations, thereby measuring three positions. Thus, it is not necessary to tilt the device from a normal, horizontal operating position in order to fully test its EM emissions.

BRIEF DESCRIPTION OF THE DRAWINGS

FIG. 6 is an illustration multiple projections of the TEM cell of the present invention, including a top projection, a side projection before .(dotted line) and after (solid line) rotation, and an auxiliary view showing the TEM cell elevated at an angle of 54.7 degrees along an axis directed through the test volume with said axis being at an angle of 45 degrees to the longitudinal axis of the TEM cell, before (dotted line) and after (solid line) rotation.

DETAILED DESCRIPTION OF THE PREFERRED EMBODIMENT

Figure 1:
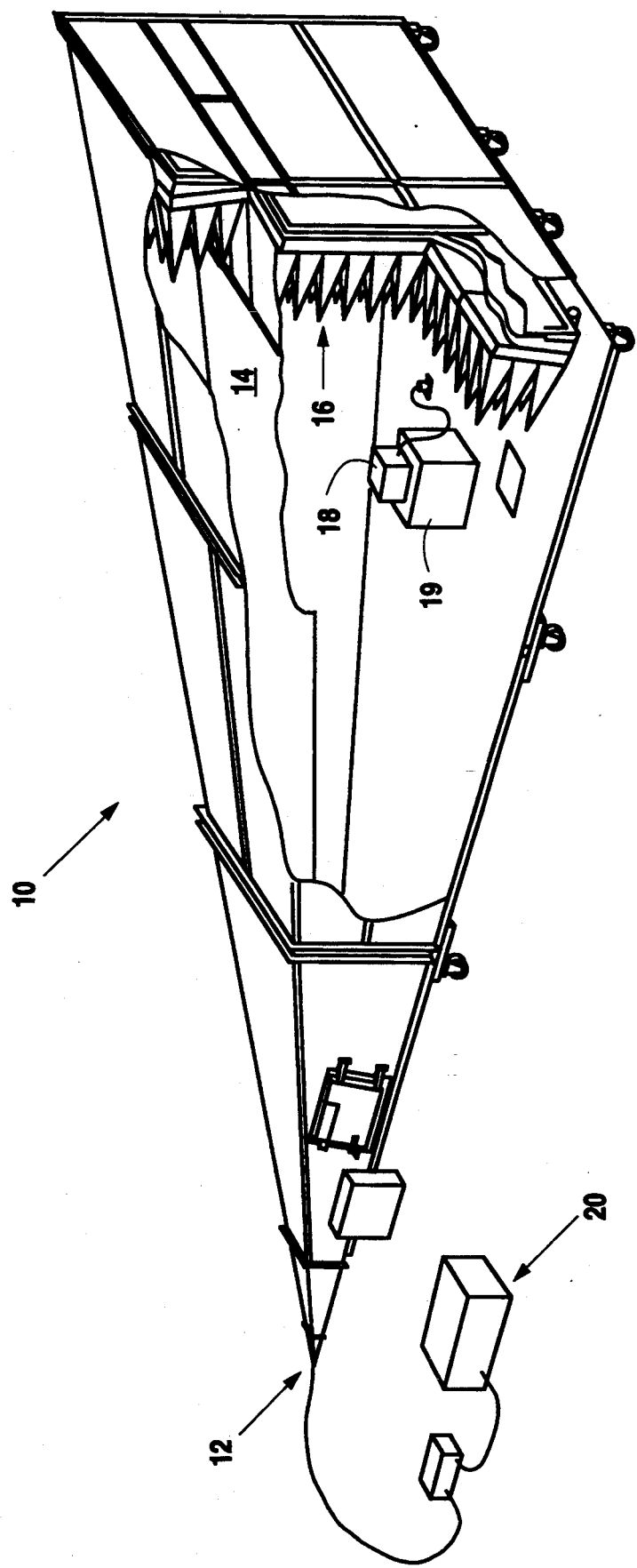
FIG. 1 is an illustration of a transverse electromagnetic (TEM) cell of the type used in the present invention.

FIG. 1 is an illustration of a TEM cell 10 of the type employed in the present invention. Details relating to the construction and operation of such a TEM cell are provided in U.S. Pat. No. 4,837,581, issued to Hansen et al on Jun. 6, 1989, which by this reference is incorporated for all purposes.

As can be seen in FIG. 1 the TEM cell has a generally pyramidal shape with a rectangular cross section. Although not discernible in the drawing, coaxial feed 12 is provided at the vertex of the pyramid. For immunity testing a pulse or sinusoidal generator 20 can be connected to the TEM cell waveguide by means of a coaxial cable attached to the bushing. An electric field is directed along the longitudinal axis of the TEM cell between the source at the vertex 12 and an absorber wall 16, which is comprised of a plurality of pyramid-shaped radio frequency absorbers which are appropriately terminated to provide a desired impedance value.

The device under test (DUT) 18 is supported on a platform 19 in the interior of the TEM cell at a location referred to as within the central test volume. The DUT may be connected to the appropriate performance monitoring instrumentation on the exterior of the TEM cell. Test instrument 20 is connected to the TEM cell via RF port 12. Field sensors can also be placed in the interior of the TEM cell to provide measurement of the electric field in the interior of the TEM cell at the location of the DUT.

Figure 2:
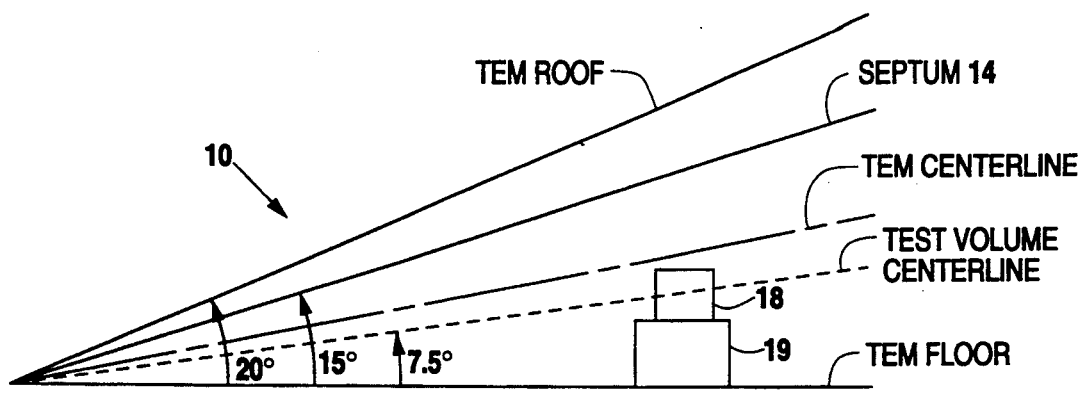
FIG. 2 is a cross-sectional side view of a TEM cell showing the position of the device under test with respect to the TEM cell test volume.

FIG. 2 is a cross-sectional side view of a TEM cell showing the DUT positioned in the TEM test volume. The exact location of the test volume depends on the physical dimensions of the particular TEM cell. By way of example, the TEM cell used in the present invention has angle of 20 degrees between the roof and floor and an angle of 15 degrees between the septum (center conductor) and the floor. The centerline of the cell lower volume is shown in FIG. 2 as an axis at an angle of 7.5 degrees (one half of 15 degrees) with respect to the floor of the TEM. The DUT 18 is shown positioned along the centerline of the axis in the center and the longitudinal axis of the test volume. It is emphasized that the position of the test volume centerline Will vary with the dimensions of the TEM cell and, therefore, Other TEM cells will have test volume centerlines at locations different from that illustrated in FIG. 2.

Although the TEM cell is Often used to measure the effect of electric fields on a DUT, it can also be used to measure the radiation emitted by the DUT. The EM emissions of an electronic device are the result of the additive contribution of many circuit elements of the device which act like antennas and radiate EM energy.

Any circuit element of a device that emits radiation can have its emissions characterized by one or more vectors. In performing an EM emissions test of an electronic device, a right-handed rectangular coordinate system with X, Y and Z axes is associated with the physical dimensions of the TEM cell. The TEM cell is able to take measurements along only one axis (generally assigned +Y). Also a coordinate system with X', Y', and Z' axes is associated with the DUT and is defined such that the "'" axes are initially aligned with the coordinate system of the TEM cell. Having defined such coordinate systems, each of the three emission component vectors from the DUT can be measured. To actually measure each of the components, the DUT must be repositioned so that each of the mutually orthogonal axes of the DUT (+X', +Y' and +Z') is successively aligned with the measurement axis (+Y) of the TEM cell.

In prior art TEM cells, alignment of the first axis of the DUT with the E-field measurement axis is readily accomplished. By simply rotating the electronic device by 90 degrees around two perpendicular axes to the longitudinal axis of the TEM cell the second axis of the DUT may be measured. An additional rotation of 90 degrees around these two axes aligns the next axis. For some devices this presents no problem. For many devices, however, such as laser printers or copy machines, tilting of the device prevents proper and normal operation during the EM emissions testing. Thus, prior art TEM cells cannot measure the components of EM emissions not along the measurement (+Y) axis without tilting the device from a horizontal position. Without tilting, the other E-field vector components can never align with the measurement axis.

The TEM cell of the present invention, as discussed in greater detail below, is adapted to measure the EM emissions of a DUT without the need to tilt the DUT. This is accomplished by orienting the TEM cell and the DUT such that the orthoaxis of the TEM cell is aligned with the gravity vector and the DUT is in its normal horizontal position. Incremental 120 degree rotations of the DUT about the gravity vector will expose the mutually orthogonal axes (X', Y' and Z') of the DUT to the TEM cell measurement axis (+Y). To understand the operation of the TEM cell in this configuration it is first necessary to relate the geometry of the X, Y, and Z coordinate system used in prior systems to the coordinate system used in the present invention.

Figure 3:
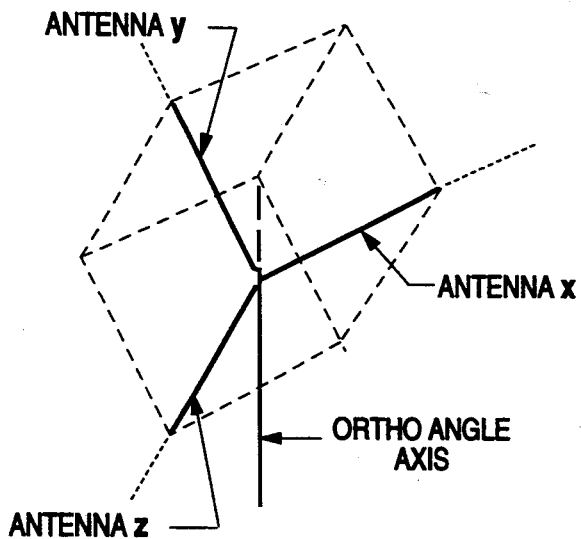
FIG. 3 is an illustration of a hypothetical cube having an antenna along three (rectangular) orthogonal axes thereof.

FIG. 3 is an illustration of three antennas oriented along mutually orthogonal axes to define three edges of a cube. The cube has an orthoaxis which lies on the diagonal of the cube, with the angle between each antenna and the orthoaxis being 54.7 degrees. Rotation of the triad of antennas in increments of 120 degrees, as illustrated in FIG. 4, will expose each of these orthogonal antennas to a field initially aligned with one of the antennas.

Figure 4:
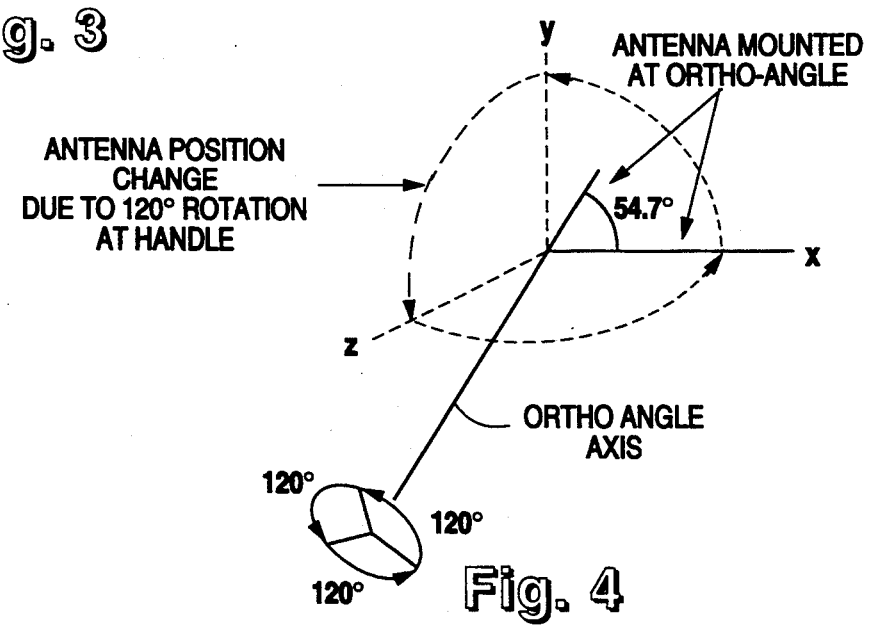
FIG. 4 is an illustration of rotation of the cube of FIG. 3 about an orthoaxis of the cube.
Figure 5A:
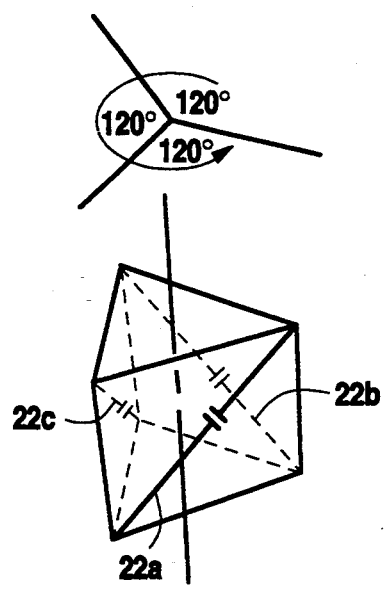
FIGS. 5a-5c are an illustration of a body having a generally triangular cross-section illustrating the principle of rotation in 120 degree increments to sequentially present three mutually orthogonal antennas to a field initially aligned with one of the antennas.
Figure 5B:
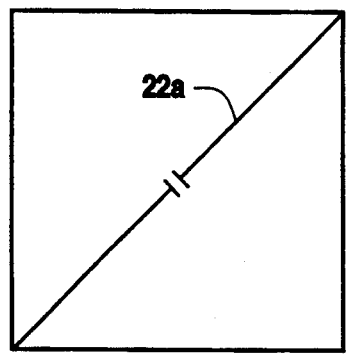
Figure 5C:
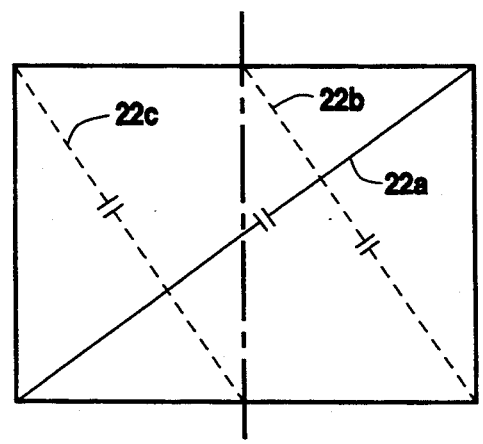

In the system illustrated in FIG. 4, the antennas have a mutual vertex. It is not necessary, however, that a DUT be positioned such that the antennas are oriented with a mutual vertex. Although it is not readily apparent, it can be shown that antennas at an angle of 35.3 degrees to the horizontal on three faces of a body having an equilateral triangular cross-section, as illustrated in FIGS. 5a-5c, can be rotated in 120 degree increments to present three mutually orthogonal antennas to an electric field initially aligned with one of the antennas. Further, it can be shown that the antennas of a DUT can be equated to the diagonal lines 22a-22c on the faces of the body shown in FIG. 5a. FIG. 5b is a side view of one of the faces of the body with the antenna 22a illustrated as a diagonal line; FIG. 5c is a side view illustrating of the projection of the three antennas 22a-22c.

In the TEM cell of the present invention, the TEM cell and the DUT are oriented such that the two 120 degree rotations of the DUT exposes three mutually orthogonal axes of the DUT to the measurement axis of the TEM cell. The rotation axis of the DUT is always aligned with the gravity vector.

FIG. 6 illustrates the rotation of the TEM cell to align the orthoaxis of the TEM cell with the gravity vector. A diagonal illustrated by reference numeral 30 intersects the longitudinal axis of the TEM Cell at an angle of 45 degrees. The dashed lines 10a and 10b in FIG. 6 illustrates a side view and a view along the rotation axis respectively, of the TEM cell prior to rotation to obtain orthoaxis alignment. To align the orthoaxis of the TEM cell with the gravity vector, the TEM cell is rotated about the diagonal 30 such that the corner 32 of the TEM cell is moved downward. With the TEM cell rotated to the position illustrated in FIG. 6, the lower surface of the TEM cell will be at a 54.7 degree angle with respect to the horizontal, when viewed along the axis of rotation. It will be apparent to those skilled in the art that the TEM cell could be rotated about axis 30a by lowering the corner 32a in order to tilt the TEM cell in the opposite direction, while obtaining the same results. Furthermore, the angle between the diagonal 30 and the longitudinal axis of the TEM cell will vary depending on the rotational reference points chosen.

Figure 7:
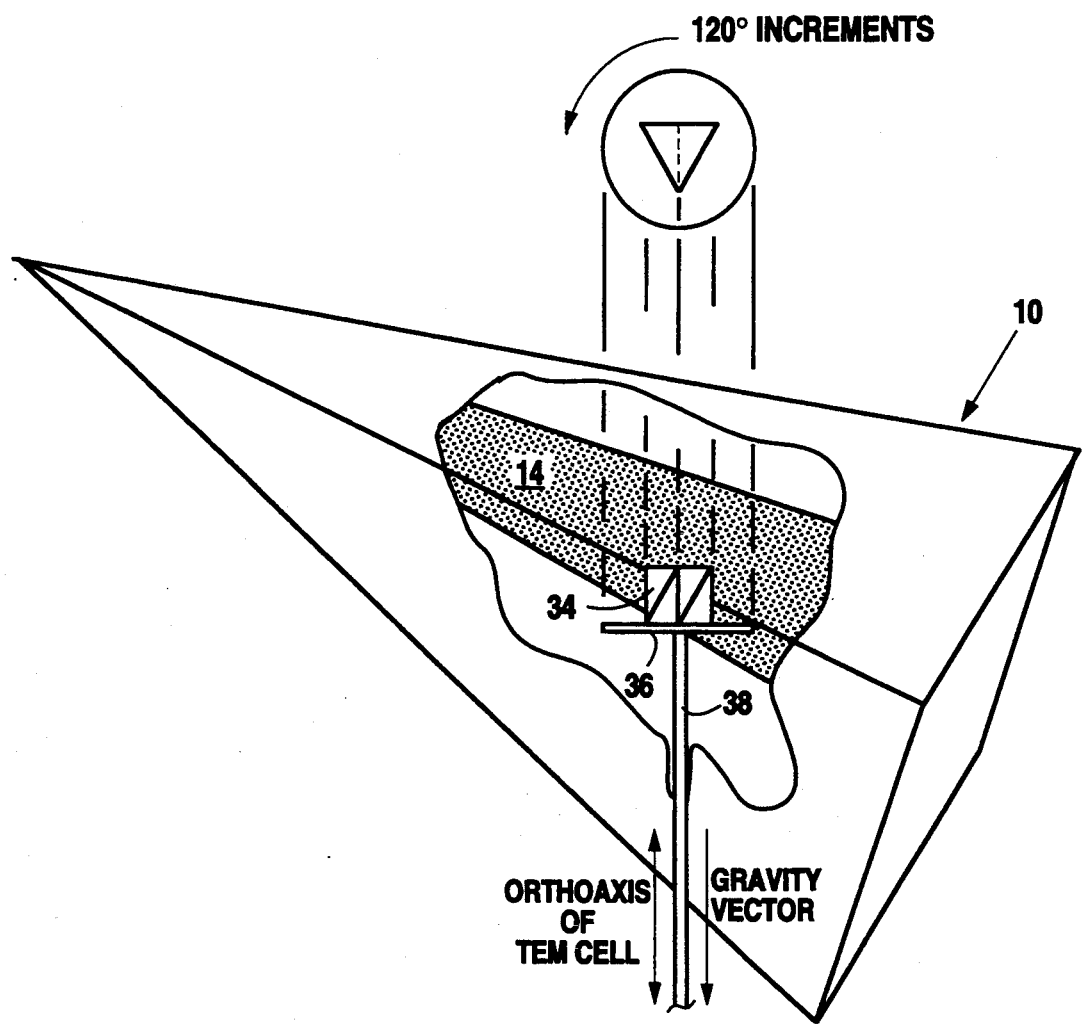
FIG. 7 is an illustration of the TEM cell of the present invention elevated at the angles illustrated in FIG. 6 with a rotatable platform received therein.

FIG. 7 is an illustration of the application of the geometry illustrated in FIG. 6, to the improved TEM cell of the present invention. The DUT is illustrated by the triangular body 34 supported on a rotatable platform 36 which is mounted on a shaft 38 extending through the floor of the TEM cell 10. The orthoaxis of the TEM cell is aligned with the gravity vector. Furthermore, one of the equivalent antennas of the DUT is aligned with the measurement axis of the TEM cell. By rotating the platform horizontally in 120 degree increments, as discussed above in connection with FIGS. 4a-4c, each of the orthogonal elements of the DUT (+X', +Y' and +Z') will be aligned with the measurement axis (+Y) of the TEM cell without the need to change the vertical orientation of the device under test.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. An apparatus for electromagnetic emissions and immunity testing, comprising:
   a transverse electromagnetic cell having an interior, a test volume and an orthoaxis, said orthoaxis of said transverse electromagnetic cell being aligned with a vector corresponding to the force of gravity;
   means for supporting a device under test in the test volume of said transverse electromagnetic cell at a position corresponding to the orthoaxis of said transverse electromagnetic cell; and
   means for rotating said means for supporting a device under test about said orthoaxis of said transverse electromagnetic cell to expose multiple equivalent antenna components of a device supported thereon to said test volume of said transverse electromagnetic cell.

2. The apparatus according to claim 1, said means for supporting said device comprising a substantially horizontal and rotatable platform having a top surface and being positioned in said transverse electromagnetic cell in said interior so that the axis of rotation of said platform is parallel to the gravity vector.

3. The apparatus according to claim 2, said means for rotating comprising means for rotating said rotatable platform in increments of 120 degrees.

4. An apparatus for electromagnetic emissions and immunity testing, comprising:
   a transverse electromagnetic cell having an interior, a test volume and an orthoaxis, said orthoaxis of said transverse electromagnetic cell being aligned with a vector corresponding to the force of gravity;
   a device under test; and
   a substantially horizontal and rotatable support means received in the interior of said transverse electromagnetic cell at a position corresponding to the orthoaxis of said cell, said device under test being supported thereon, said support means being rotatable about said orthoaxis of said transverse electromagnetic cell to expose multiple equivalent antenna components of said device under test to said test volume of said transverse electromagnetic cell.

5. The apparatus according to claim 4, said support means comprising means for rotating said rotatable platform in increments of 120 degrees.

6. A method for electromagnetic emissions and immunity testing, comprising the steps of:
   supporting a device under test in the test volume of a transverse electromagnetic cell at a position corresponding to the orthoaxis of said transverse electromagnetic cell, said orthoaxis of said transverse electromagnetic cell being aligned with a vector corresponding to the force of gravity; and
   rotating said device under test about said orthoaxis of said transverse electromagnetic cell to expose multiple equivalent antenna components of said device to said test volume of said transverse electromagnetic cell.

7. The method according to claim 6, said step of exposing said multiple antenna components to said test volume of said transverse electromagnetic cell comprising the step of rotating said device in three 120 degree increments about a rotation axis which is aligned with the gravity vector.

* * * * *